United States Patent [19]
Bloy

[11] 4,368,435
[45] Jan. 11, 1983

[54] SYSTEM FOR MAXIMUM EFFICIENT TRANSFER OF MODULATED AUDIO FREQUENCY ENERGY

[75] Inventor: Graham P. Bloy, Bangkok, Thailand

[73] Assignees: Alfred F. Eberhardt; Marvin Coghill, both of Bangkok, Thailand; a part interest to each

[21] Appl. No.: 265,990

[22] PCT Filed: Oct. 3, 1980

[86] PCT No.: PCT/US80/01331
§ 371 Date: Oct. 3, 1980
§ 102(e) Date: Oct. 3, 1980

[87] PCT Pub. No.: WO82/01290
PCT Pub. Date: Apr. 15, 1982

[51] Int. Cl.³ .............................................. H03G 7/06
[52] U.S. Cl. .............................. 330/133; 179/1 VL; 330/2; 330/126; 330/281; 330/306
[58] Field of Search ................... 330/2, 126, 133, 278, 330/279, 281, 306; 179/1 A, 1 D, 1 VL; 333/14, 28 T

[56] References Cited
U.S. PATENT DOCUMENTS 3,818,149 6/1974 Stearns et al. ................. 179/1 D X
4,045,748 8/1977 Filliman ............................. 330/126

Primary Examiner—James B. Mullins
Attorney, Agent, or Firm—Kalish & Gilster

[57] ABSTRACT

An audio processing system for maximizing the efficiency of transferring audio frequency signals. Signals to be processed are supplied to a bandpass input filter, then to a primary active frequency control. Its output drives a primary voltage compressor selectively limiting audio dynamics to a predetermined window, the latter being controllably preset and driven with different audio bands of amplitude determined by the primary frequency control to maximum compression levels indicated by a visual indicator. The output of the primary compressor is presented to a secondary active frequency control driving a secondary dynamic compressor with different audio bands. A second visual indicator indicates maximum compression levels of the latter. An automatic gain control (AGC) tied to the secondary compressor supplies feedback to the primary voltage compressor via AGC circuitry to control primary compression as a function of average, overall dynamic compression of the system. The AGC circuitry also feeds a third visual indicator which displays average compressed output voltage. The processed output of the secondary compressor is provided to a bandpass output filter and, sharply frequency attenuated by the latter, is delivered for further use. A high level output stage is also selectively utilized for driving auxiliary devices.

24 Claims, 13 Drawing Figures

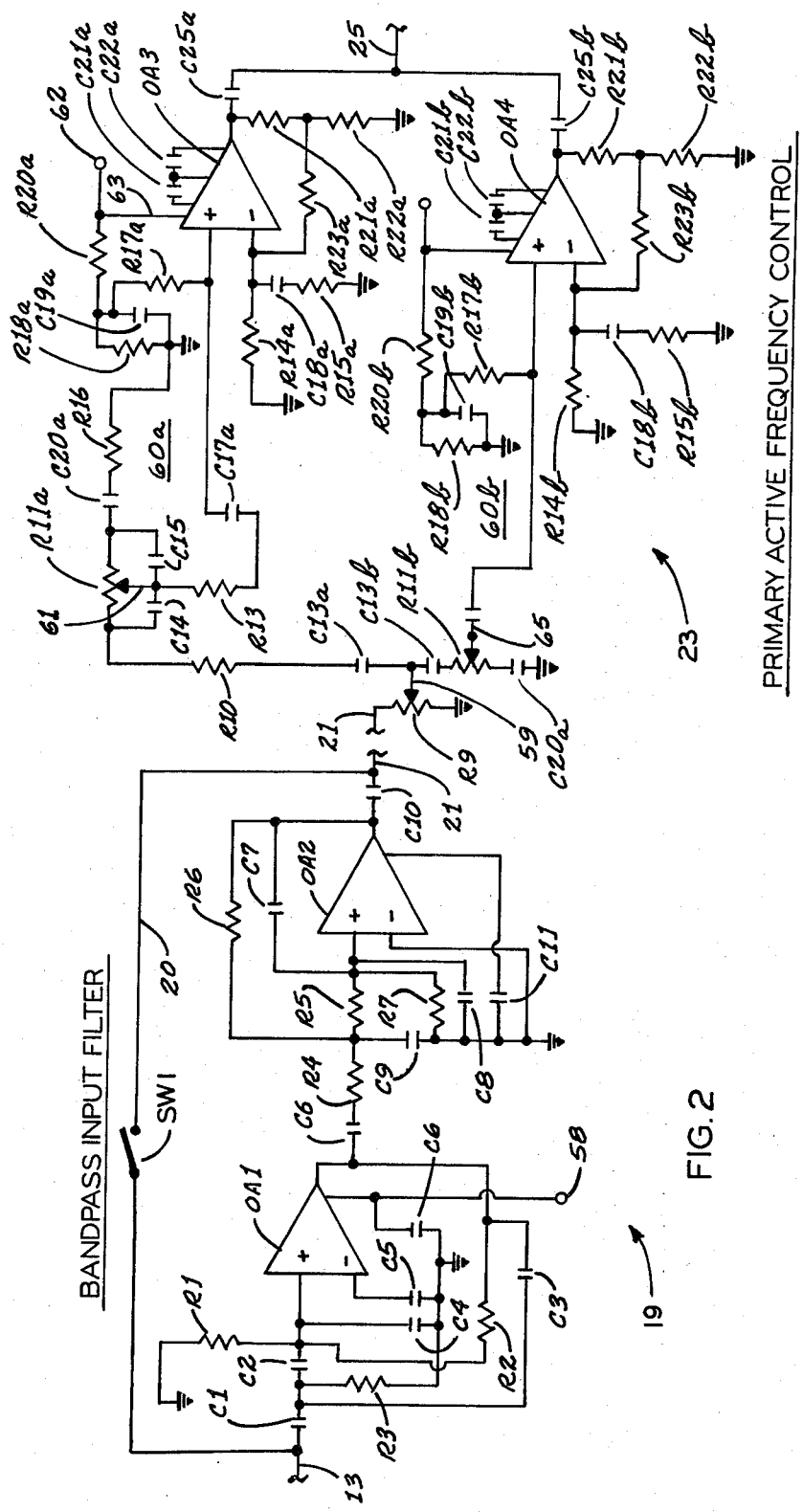

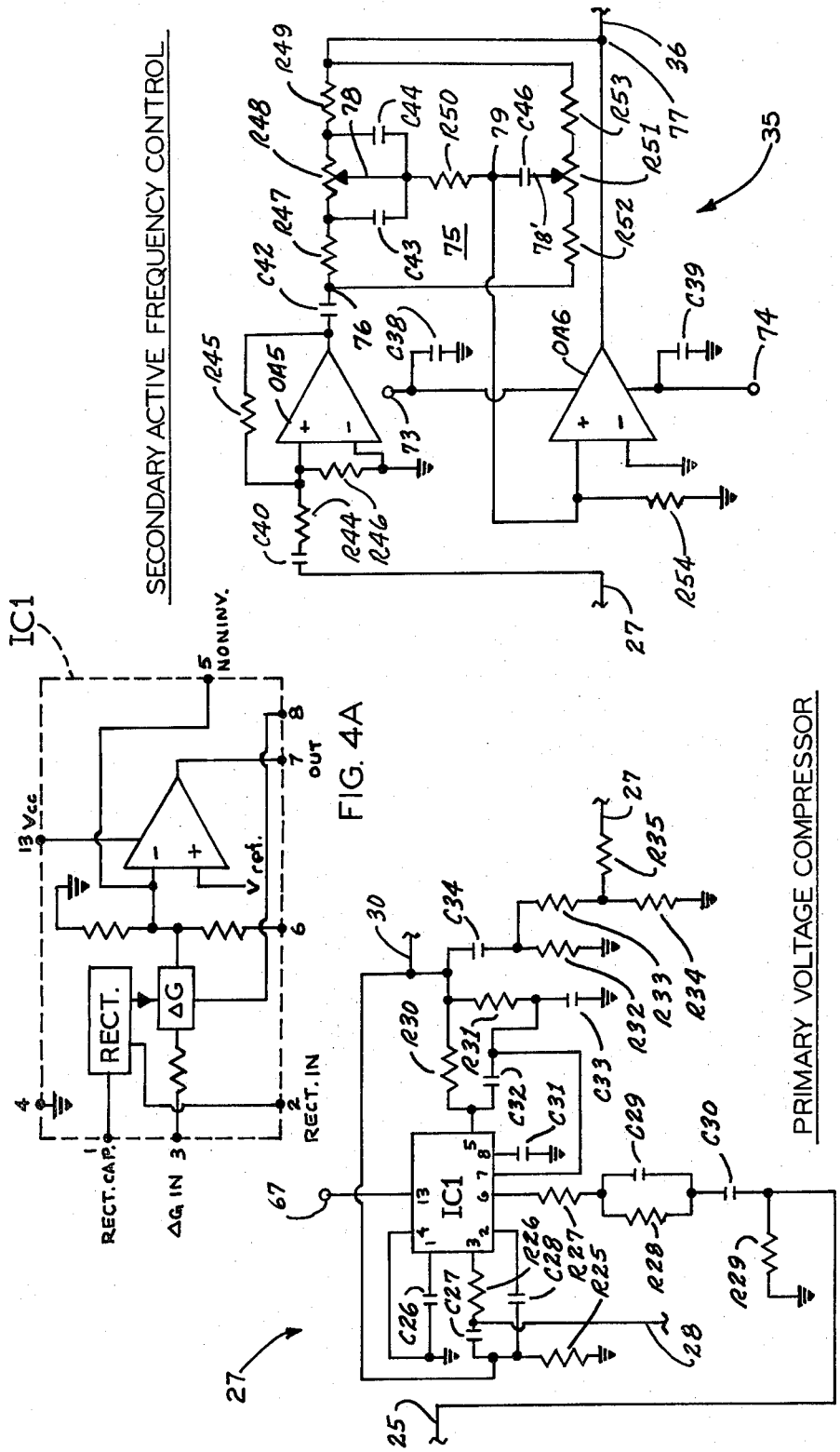

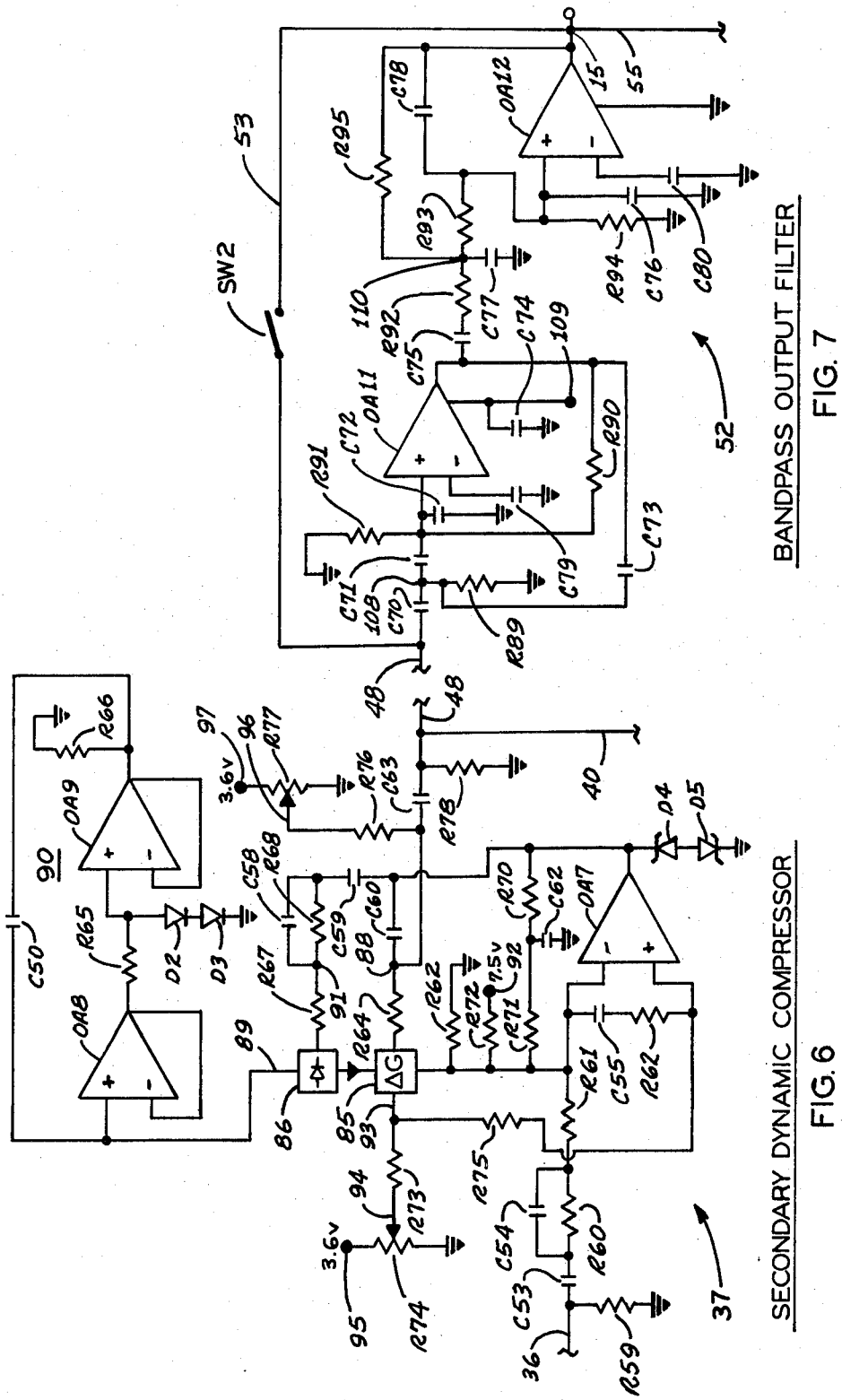

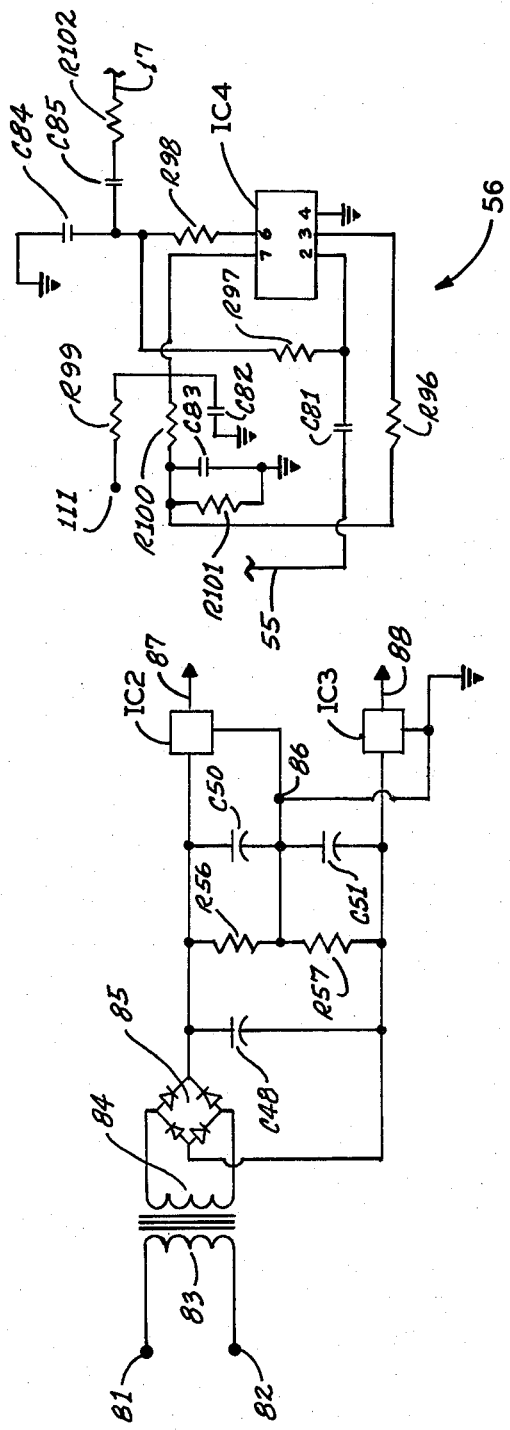

SYSTEM FOR MAXIMUM EFFICIENT TRANSFER OF MODULATED AUDIO FREQUENCY ENERGY

BACKGROUND OF THE INVENTION

The present invention relates to audio processing and modulation systems and, more particularly, to an improved audio processing system intended for maximizing the efficiency of transferring audio frequency signals for providing high modulation power and for enhancing signal intelligibility and clarity while avoiding loss of audio dynamics.

In the radio frequency transmission and reception of modulated signals a major problem has always been to obtain a high level of dynamic amptitude while not only containing the full spectrum of speech harmonics but also keeping the audio band width of the transmitted radio signals as narrow as possible.

Many modes of radio operation and types of audio or other signal modulation have been used where these matters are of great concern. Principle forms of modulation presently in use are AM, SSB and FM. AM and FM utilize a constant carrier principle while SSB has a direct audio-into-power-out relationship, and is not a constant carrier mode of transmission when the carrier is suppressed, as is quite common.

Frequency Modulation (FM)

In constant carrier FM modes, the dynamic content of the signal and the audio band width of the signal are directly proportional to the amount of deviation allowed to be imposed on the carrier. E.g., in narrow band FM transmissions, an audio band width of 5 kHz may be imposed. As a result, dynamic harmonics of voice characteristics are restricted and lost.

Amptitude Modulation (AM)

In the constant carrier mode of amptitude modulation, dynamics are expressed in a direct relationship with the amptitude of the constant carrier and audio frequency band width being theorectically limited only by the radio frequency band width available. In commercial communication systems utilizing the amptitude modulation mode of transmission, the audio band width usually is restricted to eliminate spurious amptitude modulated pulses resulting from ignition and other electrical noise and atmospheric conditions, etc., inter alia. An AM mode now commonly used takes the form of pulse amptitude modulation (PAM), as in teletype and data transfer systems.

Single Side Band (SSB)

The more recent mode of SSB modulation is by far the most efficient form of transmitting an audio modulated radio frequency (RF) signal. The major drawback of this mode of modulation is the extremely restricted audio band width imposed, resulting in extreme losses of dynamic intelligibility. These losses are often traded off against the high efficiency of SSB systems.

Characteristics of Human Speech With Reference to Radio Transmission

Relative to radio transmission, attributes of human speech of concern are dynamic amptitude and harmonic relationship. The latter is extremely important in identification intelligibility.

Dynamic amptitude can be defined as the varying level of audio received by a modulation stage in any mode of modulation. The human voice is made up by a complex structure of harmonics, the main bands of harmonics falling within a 3 kHz band width. A speech band pass frequency commonly selected is 300 Hz to 3,000 Hz, and all other harmonics are generally suppressed. However, these out-of-bands harmonics define voice character and, thus, intelligibility. But the suppressed harmonics fall in such a wide spectrum that if the entire speech harmonic make-up were to be transmitted, a transmission band width of some 15 kHz would be required. With modern narrow band voice transmission systems, this would become impossible.

Consequently, speech processing has been utilized heretofore.

For example, the use of band pass frequency filters in speech transmission systems is very common. Although speech band pass frequencies often vary, the pass band rarely exceeds 3 kHz. This type of processing is used chiefly with narrow band audio transmission systems. It has the advantages of being not only simple and economical to provide but also offering the expedient of limiting the power band of speech to a 3 kHz window that can be readily utilized in audio transmission systems.

When electrically processed, signals representing human speech inevitably vary greatly in amptitude. The audio content of the transmitted signal thus varies accordingly. Yet the received audio level can only be taken as an average between the maximum and minimum dynamic amptitudes transmitted. One way of increasing the average received audio level is to use a speech compression system between the audio sound and the modulation system, resulting in a higher average level of modulation and effectively increasing the transmitted audio power. However, in increasing the lower level sequences to effectively increase the average audio content of the transmitted signal, all speech dynamics have to be sacrificed. Thus increase in the transmitted or received audio level, after compression, must be traded off against speech intelligibility. Audio compression has been best utilized in teletype and data transmissions systems in which single frequency pulses are transmitted and dynamics are not of concern.

Circuitry providing gain control for high and low audio bands and subsequent compression of a mixed audio signal is described in Bloy U.S. patent application Ser. No. 59,394, entitled "Complete Audio Processing System", now abandoned.

In addition to filtering and compression techniques, various other types of processing have been used in commercial broadcasting systems. Where the speech input to the modulator is not considered adequate in dynamic amptitude, simple preamplifier devices are often used. More recently developed are RF processors which, in addition to controlling a compressed signal to the modulator, also control the RF output stage of the transmitter. The latter type of system is, however, both complex and expensive. Even so, its use sometimes results in audio distortion.

SUMMARY OF THE INVENTION

An object of the invention is to provide a system for maximizing the efficiency of transfer of modulated audio frequency energy.

A further object of the invention is to provide such a system useful with modulation systems.

A further object of the invention is to provide such a system for providing transfer of audio frequency signals in such a way that high average modulation power is attainable.

A still further object of the invention is to provide such a system for providing transfer of audio frequency signals to enhance signal intelligibility and clarity while providing loss of audio dynamics.

Another object of the invention is to provide such a system which allows the processing of audio signals demodulated from received RF signals in order to retrieve audio signals with effectively high signal-to-noise ratios even where there is high noise level associated with the received RF signals.

A further object of the invention is to provide such a system which can be utilized for processing of audio frequency signals prior to their use in modulating a transmitted RF signal, as well as processing demodulated audio frequency signals upon reception of the transmitted RF signal.

An additional object of the invention is the provision of such a system which is useful with various modulation systems and modulation stages to achieve maximum carrier utilization, with result in increase in effective transmitted power and clarity.

Another object of the invention is the provision of such a system which processes audio frequency signals in such a way as to reconstitute wide frequency spectrum dynamics associated with voice and other audio frequency signals used, inter alia, for modulation of RF transmission, and which does so by recovery and amplification to audible levels of harmonics otherwise suppressed or filtered.

A related further object of the invention is the provision of such a system which permits transmission of audio signals with high average modulation levels, approaching 100% average modulation, but without customary dramatic loss of audio dynamics and intelligibility.

An object of the invention also is the provision of such a system which can be utilized in the fields of RF transmission not only of speech but also high speed data, teletype, facsimile, and other modes of data communication, and when so utilized in data communication, may be advantageously part of a data communication link for reducing data drop-out.

It is also an object of the invention to provide such a system which not only is relatively simple and utilizes integrated, compact circuit components but which also is conductive to simple operation, having a minimum of useable controls that once set to the application at hand need no further adjustment.

A related further object of the invention is the provision of such a system utilizing various visual indicators for keeping the user constantly informed and aware of the extent to which signals are properly processed through the system.

An additional object of the invention is the provision of such a system which accepts substantially any low level signal within the audio frequency spectrum while according to the user the options of utilizing and emphasizing various components of the audio spectrum, and of selectively utilizing filtering of the input and/or output signals.

Another object of the invention is the provision of such a system in which the output of the audio signals processed through the system can be preset in amplitude to be fed to any modulation stage currently used in conventional communication systems.

A further object of the invention is the provision of such a system which is especially of advantage in connection with narrow band VHF transmission, making possible extraordinarily narrow band transmission containing full dynamic characteristics of audio frequency signals so processed while keeping a very high character level of modulation.

Among other objects of the invention may be noted the provision of such a system which can be utilized in connection with AM, FM, SSB, PAM, FSK (frequency shift keying) and tone activated TTY transmissions, which also can be utilized in public address application and music amplification systems.

Finally, among still other objects of the invention may be noted the provision of such a system which allows individual tailoring of harmonic response curves depending upon natural frequencies of voice signals; which allows continuous audio frequency gain control; which achieves linear tracking during audio processing; which operates to eliminate or greatly reduce third harmonic distortion; which operates to reconstitute out-of-band dynamics for allowing them to be transmitted on a narrow band signal; which makes use of solid state integrated circuit technology; which is essentially uncomplicated as well as being simple to use and maintain; which can advantageously be operated from a low voltage or battery power supplies; and which exhibits low power consumption and inherent high efficiency during operation.

Other objects and features will be in part apparent and in part pointed out hereinbelow.

Briefly, an audio processing system of the invention includes circuitry by which audio frequency signals to be processed are supplied to a bandpass input filter and, thus filtered, to a primary active frequency control. The output of the latter drives a primary voltage compressor shich selectively limits audio dynamics to a predetermined window, being controllably preset and driven with different audio bands of amplitude determined by the primary frequency control to maximum compression levels indicated by a visual indicator. The output of the compressor is presented to a secondary active frequency control which drives a secondary dynamic compressor with different audio bands. A second signal indicator indicates maximum compression levels of the latter. An automatic gain control tied to the latter compressor supplies feedback to the primary voltage compressor and also feed a third visual indicator which displays compressed output voltage as well as average peak dynamic compression. The processed output of the secondary compressor is provided to a bandpass output filter and, sharply attenuated by the latter, is delivered for further use. A high level output stage is also selectively utilized. The AGC feedback signal to the primary compressor limits primary compression as a time-delayed function of increase in the level of the secondary compressor output. The primary and secondary compressors may be regarded as respective first and second dynamic control means, the primary and secondary active frequency controls as respective first and second tonal control means, since both compressors and both active frequency controls are configured for permitting selective controlling of their respective functions. The bandpass input and output filters each may be selectively switched in or out of the signal processing path. The third visual indicator may be a meter having a moving coil-type movement to provide an averaging display.

BRIEF DESCRIPTION OF THE DRAWINGS

FIG. 2 is a schematic circuit diagram of a bandpass input filter of the circuitry of FIG. 1.

FIG. 3 is a schematic circuit diagram of a primary active frequency control circuit of FIG. 1.

FIG. 4 is a schematic circuit diagram of a primary voltage compressor of the system of FIG. 1.

FIG. 4A is a block diagram of an integrated circuit device forming part of the primary compressor of FIG. 4.

FIG. 5 is a schematic circuit diagram of a secondary active frequency control of the system of FIG. 1.

FIG. 6 is a schematic circuit diagram of a secondary dynamic compressor of the system of FIG. 1.

FIG. 7 is a schematic circuit diagram of a bandpass output filter of the system of FIG. 1.

FIG. 10 is a schematic circuit diagram of an active filter power supply utilized in the system of FIG. 1.

FIG. 11 is a circuit schematic diagram of an audio frequency amplifier utilized in the system of FIG. 1.

Corresponding reference characters indicate corresponding parts throughout the several views of the drawings.

DESCRIPTION OF THE PREFERRED EMBODIMENT

General Description of the System

Figure 1:
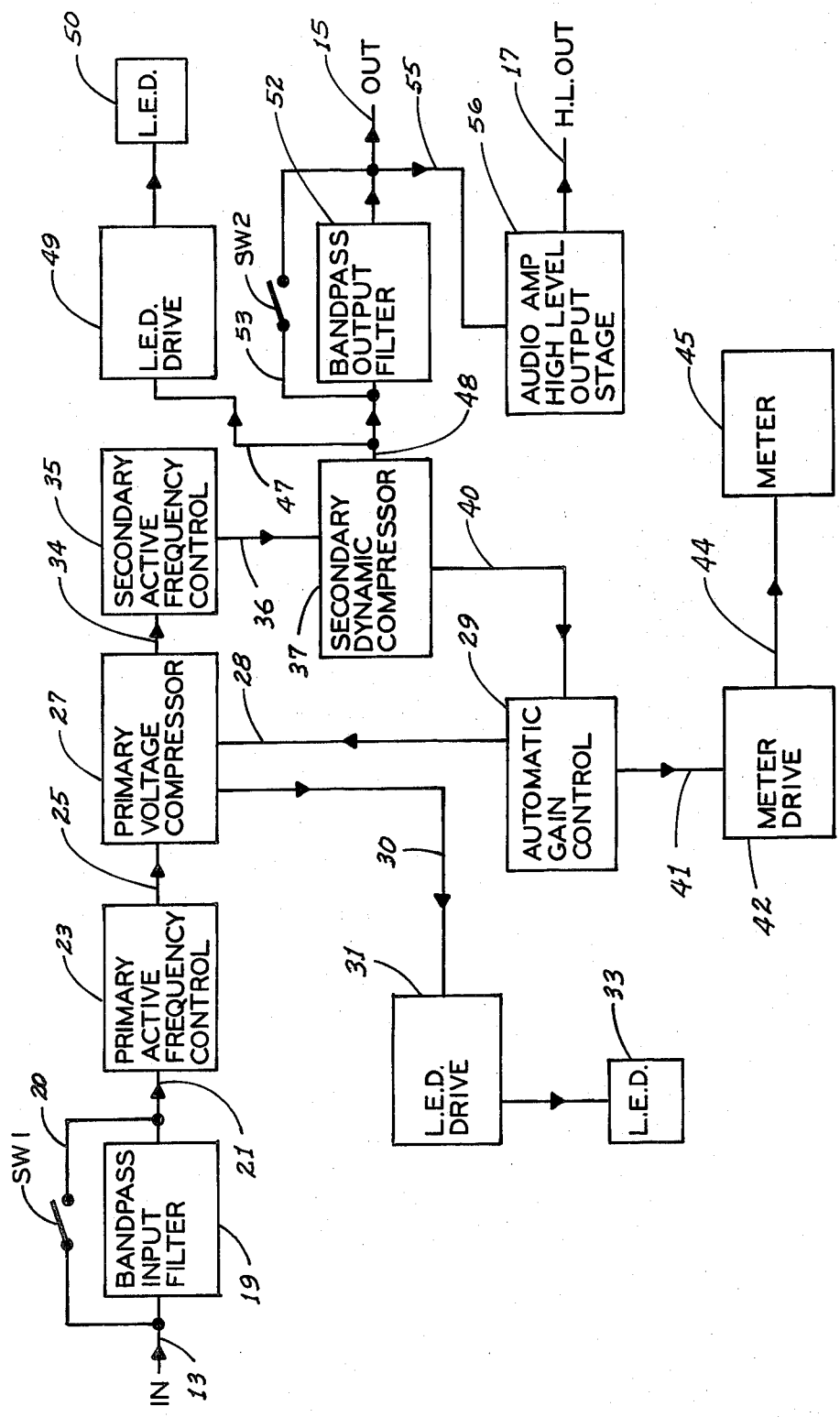
FIG. 1 is a block diagram of a system constructed in accordance with and embodying the present invention.

Referring now to the drawings and particularly to FIG. 1, the overall relationship of various circuits of a system of the invention are shown in block diagrammatic form.

Audio frequency signals to be processed by the system are delivered to an input at 13 from any of myriad possible sources, such as the output of a microphone, preamplifier, an intermediate amplification stage in a modulation system, or tape recorders, the output of an intermediate frequency stage of an RF transmitter receiver, etc. and may consist of tone pulses, frequency shift keying pulses, tone encoded information, teletype signals (TTY), facsimile, date signals, and voice transmissions, and other tone-related or audio signals. The signals, after being processed through circuitry of the system, are delivered for further use by an output 15. An auxiliary output 17 is provided for presenting output signals of high levels. Output signals delivered by output 15 are utilized for purposes such as the driving of a modulator, for delivery to an audio amplification stage, further audio processing or various purposes such as amplification, recording, decoding, retransmission, and so forth. The high level output provided by output 17 may be utilized for driving various recording devices, such as oscilloscopes, spectrum analyzers, and the like, without limitation.

Although it is to be emphasized that although the system is primarily intended for processing audio frequency information containing voice content or speech, tones and tonal data of various types of an audio frequency, as alluded to above, may be processed advantageously by the invention, such as to improve signal-to-noise ratio (S/N) and/or achieve other objects of the invention. Thus, it is to be understood that the system of the present invention is utilized for transferring audio frequency signals in such a way that the efficiency of transfer is maximized or optimized by processing the signals for various purposes such as, for example, to provide high average modulation power, to enhance signal intelligibility, to provide high clarity of signal transmission, to avoid loss of audio dynamics, among numerous other objects hereinabove stated.

Input 13 delivers audio signals to a bandpass input filter 19 for providing filtering of frequencies to achieve a pass band of between 30 Hz and 3 kHz. Filter 19 effectively limits all other frequencies. The pass band thus achieved is merely that preferred and utilized to advantage in the operation of the present system and may be varied in accordance with the purpose intended for the present system, e.g., in having different widths and different lower and upper frequency limits. A switch SW1 connected by a circuit lead 20 between input 13 and the output 21 of filter 18 permits selective disablement of filter 19 for purposes noted hereinbelow.

The output of the bandpass is delivered by output connection 21 to a primary active frequency control 23. Control 23 effectively splits the audio spectrum of the signals delivered to it into two separate frequency bands. Preferably, although not necessarily, the lower band is from 250 Hz to 1.2 kHz and the upper frequency band is from 1.4 kHz to 3.5 kHz. Control 23 includes means for selectively controlling the amplitude of the audio content of each of these audio bands allowing the user either to attenuate or to provide gain in each of said bands over a preferably range of ±10 db. Also, the primary active frequency control 23 preferably incorporates an input gain control for purposes later appearing. The control components of circuit 23 also allowing individual tailoring of out-of-band harmonics which are reconstitued by processing of audio signals by the system.

Signals from control 23 are then provided by a connection 25 to a primary voltage compressor 27. The latter provides a relatively high compression range, i.e., preferably 135 db, as well as pre-emphasis of high frequency audio components to compensate for high frequency losses which otherwise could occur during processing. Compressor 27 is preferably selected to limit all audio dynamics to a 27 db window with a tracking error of not greater than about ±3 db. Included within compressor 27 is a variable gain cell which is indirectly controlled, via a lead 28, by an automatic gain control (AGC) circuit 29 described hereinbelow.

Also connected with compressor 27 by a lead 30 is an LED drive circuit 31 for driving an LED indicator 33 in accordance with the operation of compressor 27 to provide the system operator with an indication of the extent to which maximum useable compression is being provided by compressor 27.

The output of compressor 27 is delivered to a secondary active frequency control 35. This circuitry is adapted to split the now dynamically compressed audio signals into two frequency bands, there being a lower frequency band of preferably from about 300 Hz to 1.5 kHz and the upper frequency band of preferably from about 1.5 kHz to 3 kHz. Control 35 is adapted for providing gain and attenuation control within these two frequency bands variable over a range of preferably ±12 db. For this purpose, manual control means are provided for the user to selectively determine the gain or attenuation within each frequency band.

Unlike the primary active frequency control 23, control 35 is adapted for providing gain peaking and attenuation occurring about center frequencies with the respective lower and upper bands at preferably 1 kHz and 2.4 kHz. This feature allows control 35 to selectively disregard interacting, and possibly distortion-productive audio harmonics occurring within the input pass band established by input filter 19. The frequency controls within control circuit 35 may be set to provide neither attenuation nor gain so that not only would no gain or attenuation but also no distortion will be provided for the signal passing through control 35.

The output of frequency control 35 is fed to a secondary dynamic compressor 37. The circuitry of compressor 37 is intended to provide an extremely fast tracking system with extremely low tracking distortion (preferably less than about 0.1%) and to accept and provide compression of signals having a dynamic amplitude range of up to about 120 db while achieving a compression window of preferably only 50 db, yet to provide a third harmonic distortion (THD) figure of less than preferably 1%. AGC circuit 29 is interconnected with circuit components of compressor 37 by a connection 40 to privide an input for AGC circuit 29 which in turn controls primary voltage compressor 27 by circuit connection 28, thereby providing a negative AGC feedback loop for limiting the degree of primary voltage compression provided by primary compressor 27 as a time-delayed function of compression by secondary compressor 37, all as more fully explained hereinbelow. However, briefly it may be noted that the connection of AGC circuit 29 to compressor 37 provides to primary compressor 27 a d.c. reference signal derived from compression stages of compression 37.

In effect, AGC circuit 29 by interconnection with secondary compression 37 amplifies a tracking voltage output of the secondary compressor and delivers a voltage varying within preset parameters to a variable gain cell of primary voltage compressor 27 as a function of this tracking voltage. This is carried out for the purpose of achieving extremely high tracking stability and for limiting the third harmonic distortion while reconstituting through voltage gain via the secondary active frequency control 35 the original audio dynamics fed to secondary dynamic compressor 37. However, reconstituting of otherwise lost audio dynamics occurs as well in other portions of the system circuitry.

Interconnected as indicated at 41 with automatic gain control 29 is a meter drive circuit 43 for driving, as indicated at 44, a meter 45 preferably of a moving coil movement type to provide averaging and serving as a visual indicator for displaying not only the compressed output voltage provided by secondary dynamic compressor 37 but also average peak dynamic compression, and thus indicating the extent to which the overall capability of the system is being utilized.

Interconnected as indicated at 47 with the output 48 of secondary dynamic compressor 37 is an LED drive circuit 49 for driving an LED indicator 50 to indicate the degree of compression being achieved by secondary dynamic compressor 37. The output of compressor 37 is delivered to a bandpass output filter 52 for providing sharply attenuated bandpass filtering of the now processed audio signals. Filter 52 has preferably a pass band of between 300 Hz and 3 kHz with very sharp roll-off or corners at the edges of the pass band to limit the processed audio between these upper and lower limits. Filter 52, preferably provides unity gain and has an extremely low noise figure so as to avoid introducing further noise into the now processed audio. If desired, the filter audio provided at output 15 may be attenuated to provide signal levels suitable for other systems being driven by the present system. Also interconnected in a circuit 53 around filter 52 is a switch SW2 for selectively disabling the operation of filter 52 for purposes noted hereinbelow. The output of filter 52 is also provided, as indicated at 55, to an audio amplifier 56 constituting a high level output stage and providing the high level output 17 noted previously.

Detailed Description of Circuitry of the System

Now that the general circuitry of the system has been described, the specific circuitry of each of the blocks designated in FIG. 1 is described hereinbelow.

In the interest of clarity, not all of the various conventional power supply or similar connections are necessarily illustrated. In some cases, discrete integrated circuits as well as discrete components are utilized. But, it should be understood that some or all of the circuit devices of discrete commercial types such as those described may be replaced by circuitry involving large scale integration (LSI) or very large scale integration (VSLI). Also, certain analog processing circuitry may be supplemented, augmented, etc. by digital processing circuitry.

Additionally, it is noted that in describing a preferred embodiment, specific terminology is utilized for the sake of clarity. However, it is not intended to limit to the specific terms so selected and hence it is to be understood that each specific term includes all technical equivalents which operate in a similar to functionally homologous or synomynous manner to accomplish a similar or equivalent purpose. For example, the term "interconnected" or "connected" is not limited to a meaning of directly connected but rather includes indirect connection or connection through intervening components. Also, the term "series" or various expressions such as "series circuit", "series-connected", and the like are all to be construed as describing only the generalized attribute of a circuit path, branch, or network, rather than to mean that the same current necessarily must pass through each element so described. Accordingly, if terminals of the plurality of the elements of the present circuitry form a path between two circuit nodes, they may for convenience of reference be said to be in series even though other elements may have a connection to intermediate nodes of such path.

In the implementation of the invention, the circuit blocks may individually or in combination be assembled on printed circuit boards (PCB's) of standard size, if desired, and may be assembled in cabinetry. The various modules and blocks of FIG. 1 may be provided separately or in a combination on PCB's of the type having an arrangement of contacts along an edge for being mated to a so-called "mother" board or mainframe.

Generally speaking, interconnections between the individual circuitry described in FIGS. 2-11 are indicated by the alignment of leads.

Referring to FIG. 2, the circuitry of band pass input filter 19 is seen to comprise circuit elements providing cascaded high and low frequency seasons. An operational amplifier OA1 has its non-inverting input interconnected with input terminal 13 through a pair of capacitors C1, C2 and biased to ground through a resistor R1. Feedback between the output of the amplifier and said input is provided by a circuit including a capacitor C3 and resistor R2, with capacitor C3 being connected to a node between capacitors C1 and C2 to provide capacitive feedback for tailoring frequency response. This node is also biased to ground through a resistor R3. The non-inverting and inverting inputs are connected to circuit ground through respective capacitors C4, C5. A bypass capacitor C6 conventionally connects a power supply terminal 58 to circuit ground.

The output of operational amplifier OA1 is series-connected through a capacitor C6 and resistor R4 and a further resistor R5 to the non-inverting input of a further operational amplifier OA2. Capacitive feedback between its output and its non-inverting input is provided by a capacitor C7 for frequency response control with d.c. feedback for gain control being provided by a resistor R6. It is noted that a resistor R7 and compacitor C8 are connected in parallel between the non-inverting input and circuit ground, the node common to resistors R4, R5, and R6 being tied similarly to ground through a capacitor C9. the inverting input of operational amplifier OA2 is tied directly to ground. The output of operational amplifier OA2 is provided through a capacitor C10 to output lead 21.

A conventional bypass capacitor C11 connects operation amplifier OA2 to the circuit ground. Switch SW1, which is connected by lead 20 between said input terminal 13 and lead 21 is provided so that, when it is closed, the bandpass input filter is effectively rendered inoperative, i.e. taken out of the circuit. This adds flexibility to the system by allowing selective elimination of the bandpass input filtering under certain possible conditions of use in which it is not desired or not necessary to limit the audio signals being processed by the system to the narrow pass band ordinarily determined by the input filter circuitry 19.

The selection of various components utilized in connection with operational amplifiers OA1, OA2 is a matter of design choice to achieve the bandpass upper and lower frequency limits referred to previously. Each of the operational amplifiers may be part of a single commercially available integrated circuit (IC) type such as LM387 exhibiting electrical characteristics and perimeters compatible with the node of intended usage of the present system and requiring power supply voltages (as delivered by terminal 58) of, for example, ±15 v.d.c. As will be fully to those skilled in the art, the circuit values such as that of resistor R6 may be varied to control the gain of the bandpass input filter. But preferably filter 19 is configured to provide unity gain.

It is preferred that filter 19 provide upper and lower corner frequencies of 2.7 kHz and 300 Hz, respectively, and a roll-off characteristic of −40 db. per decade, as well as very low third harmonic distortion (THD). Filter 19, providing unity gain, preferably can handle an input signal of between −35 and +10 db. without clipping or distortion.

The primary active frequency control 23 similarly utilizes two operational amplifiers OA3, OA4 for control of the amplification of the gain of individual upper and lower frequency bands. Interconnected with each of these operational amplifiers are respective resistive-compactive circuit 60a, 60b for establishing, with the respective operational amplifier, individual circuits for providing selective amplification and control of audio frequency components within the respective audio bands.

More specifically, the input signal provided by lead 21 is delivered across a potentiometer R9 having a wiper 59 selectively variable for controlling the overall gain of stage 23. Since the two individual active frequency control circuits 60a, 60b have certain corresponding components which are connected in identical manner, corresponding elements are referred to by corresponding reference numerals with each numeral being followed by a subscript "a" or "b", as appropriate.

Circuit 60a is described exemplarily. It comprises a capacitor C13a coupling the signal present on wiper 59 through a resistor R10 to a further potentiometer R11a having a wiper 61 which is selectively controllable by the user to serve as a high frequency gain control connected from opposite sides of potentiometer R11 to its wiper are capacitors C14, C15. The signal present on wiper 61 is provided through a resistor R13 and thence through a capacitor C17a to the non-inverting input of operational amplifier OA3, which has its inverting input referenced to ground through a circuit including a resistor R14a which is in turn shunted by a series-connected capacitor C18a and resistor R15a.

The opposite end of potentiometer R11a is connected through a capacitor C20a and resistor R16 to the circuit ground. Also interconnected with the non-inverting input of operational amplifier OA3 is a frequency compensating circuit comprising resistors R17a and R18a and a capacitor C19a connected across the latter and with one end thereof being connected to circuit ground. A resistor R20a references the node between resistors R17a and R18a to the power supply potential provided to a terminal 62 for offset error compensation, said power supply potential also being provided by a lead 63 to the operational amplifier for powering same.

Negative feedback for operational amplifier OA3 is established by a voltage divider including resistors R21a and R22a and a further resistor R23a interconnecting the node between the former two resistors and the inverting input of the operational amplifier. Conventional compensating compacitors C21a and C22a are connected in the typical fashion to the operational amplifier.

As thus configured, circuit 60a together with operational amplifier OA3 constitutes an active high frequency control circuit providing gain control over frequencies determined by the setting of potentiometer wiper 61, and with gain in the frequency band being variable over the range of ±12 db within the frequency range of preferably about 1.5 kHz to 3 kHz. Gain peaking and attenuation peaking occurs preferably about 2.4 kHz. The output of operational amplifier OA3 is provided through a capacitor C25a to output lead 25.

Similarly, circuit 60b together with operational amplifier OA4 constitutes an active low frequency control circuit providing gain control frequency over frequencies determined by the setting of a wiper 65 of potentiometer C20a, and thus determining the level of signals provided to the operational amplifier OA4 through capacitor C17b. The frequency band preferably is from 300 Hz to 1.5 kHz and with gain peaking and attenuation peaking occurring at preferably about 1 kHz. The low frequency components are provided from the output of operational amplifier OA4 through a capacitor C25b and thus delivered to output lead 25.

Preferably, although not necessarily, operational amplifiers OA3 and OA4 may both be available as a single integrated circuit (IC) such as of the commercially available type UA739, thus providing high loop gain without any substantial distortion.

The mixed high and low frequency audio components provided to lead 25 are delivered to the primary voltage compressor 27. Referring to FIG. 4, compressor 27 comprises an integrated circuit IC1 constituting a compressor-expandor or so-called compandor including a fullwave rectifier, a variable gain cell and an operational amplifier including a biasing system within it, all as shown in FIG. 4A. Although a general depiction of elements thereof is represented by FIG. 4A, no specific description is necessary in view of the fact that circuit IC1 may be of commercially available form such as that designated NE570/571. But it is noted that there is an internal summing node within the operational amplifier (not shown) which is biased at a voltage preference, and signals supplied to the integrated circuit are averaged by circuitry interconnected therewith, as shown in FIG. 4. The averaged value of the input signal establishes the gain of the variable gain cell (see FIG. 4A) which is, accordingly, proportional to the average variance of the input signal capacitively coupled thereto. In any event, the operation of such circuitry is described and will be understood by reference to the above-noted pending U.S. application Ser. No. 59,394 of Graham P. Bloy, entitled "Complete Audio Processing System", filed July 20, 1979, herein incorporated by reference.

Although the gain cell of compandor circuit IC1 functions as an expandor, by providing negative feedback to the operational amplifier therein, compression is realized. Similar circuitry is utilized in secondary dynamic compressor 37 to which attention is directed, as hereinbelow described, for further understanding of the operation of primary voltage compressor 27. For present purposes, it is sufficient to observe that IC1 is interconnected as shown by pinout numerals, with the following resistive and capacitive circuit components which may have the nominal values indicated:

TABLE I

| R25 | 100 kohm | C26 | 0.47 mfd |
|---|---|---|---|
| R26 | 20 kohm | C27 | 10 mfd |
| R27 | 20 kohm | C28 | 1 mfd |
| R28 | 120 kohm | C29 | 2700 pfd |
| R29 | 100 kohm | C30 | 1 mfd |
| R30 | 47 kohm | C31 | 2200 pfd |
| R31 | 47 kohm | C32 | 5 pfd |
| R32 | 100 kohm | C33 | 10 mfd |
| R33 | 50 kohm | C34 | 10 mfd |
| R34 | 70 kohm | | |
| R35 | 50 kohm | | |

In accordance with the invention, interconnected with the gain cell of the compandor circuit IC1 is lead 28 which provides a feedback signal of a limiting character from the automatic gain control circuit 29 as a function of the overall gain signaled by gain control circuitry 29. Here it is observed that said lead 28 provides said AGC signal to the gain cell of compandor IC1 through resistor R26. The overall purpose and function of this negative feedback is discussed below but it is noted preliminarily that the gain cell within circuit IC1 is controlled in a negative sense in response to increase in the AGC signal supplied by lead 28, thereby to reduce the amount of primary compression achieved by stage 27 with increasing gain feedback. Thus the feedback is essentially negative or limiting.

At 67 is indicated a terminal for supplying low voltage d.c. potential for operation of circuit IC1. As will be apparent, the dynamically compressed output signal is provided by capacitor C34 across a load resistor R32, and is appropriately attenuated by R35 for delivery through a resistor by lead 27 to the secondary active frequency control circuitry, shown in FIG. 5. However, prior to being coupled through capacitor C34, circuit lead 30 provides the compressed audio output from stage 27 to LED drive circuit 31, as disclosed in FIG. 8.

Figure 8:
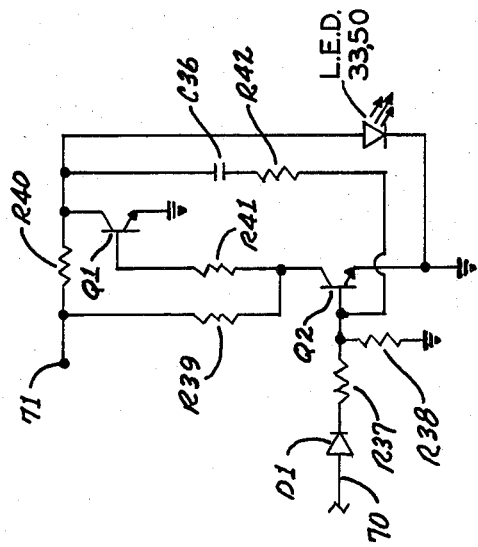
FIG. 8 is a schematic circuit diagram of an LED drive circuit including an LED indicator utilized in the system of FIG. 1.

Referring to FIG. 8, circuitry is shown for constituting the LED drive 31 and LED 33, as well as the LED drive 49 and LED 50. As shown therein, the LED indicator lamp, whether that designated at 33 or that designated at 50, is suitably mounted for being observed by the user, being driven by circuitry including a pair of NPN transistors Q1, Q2. The base of transistor Q2 is driven by a unipolar signal provided through a diode D1 and delivered through a resistor R37. The base of transistor Q1 is biased to ground through a resistor 38. Its collector is provided with a supply potential by means of a terminal 71 through a current limiting resistor R39, while a similar resistor R40 provides a supply of voltage to the collector of transistor Q1. The base of the latter is connected through a resistor R41 to the collector of transistor Q2. Coupling is provided between the collector of transistor Q1 and the base of transistor Q2 by a series connected capacitor C36 and resistor R42. Thus, there is provided a two-transistor switching circuit wherein the LED will be driven on when there is sufficient base drive provided to transistor Q2, as by the output signal of primary compressor 27 or secondary compressor 37.

Referring now to FIG. 5, the secondary active frequency control 35 functions to reconstitute harmonic dynamics lost in processing of the signal through primary compressor 27. Control 35 comprises a pair of operational amplifiers OA5, OA6 which are connected to provide high and low pass sections of a Butterworth filter. The operational amplifiers may each be of the commercially available type designated LM349 with both operational amplifiers being part of a single integrated circuit which is adapted for being powered by positive and negative potentials, as at 15 v.d.c., supplied to respective terminals 73,74. Bypass capacitors C38, C39 are connected across these power supply inputs. Each of the operational amplifiers has its inverting input connected to the circuit ground. The input signal is provided by lead 27 through a capacitor C40 and resistor R44 to the non-inverting input of operational amplifier OA5. A resistor R45 interconnects the output and latter input of the operational amplifier for feedback purposes, the input being biased to ground through a further resistor R46.

The output of operational amplifier OA5 is provided through a capacitor C42 to a frequency gain control circuit 75 having two parallel branches providing at one end a node 76 constituting an input of the circuit and an opposite node 77 interconnected with the output lead 36 of frequency control circuitry. A first one of the branches comprises a resistor R47, a potentiometer R48, and further resistor R49, there being capacitors C43, C44 connected between opposite ends of potentiometer R48 and its wiper 78. The wiper is interconnected through a resistor R50 and capacitor C46 to the wiper 78 of another potentiometer R51 forming with resistors R52 and R53 in series with it a second parallel branch of circuit 75. A node 79 between resistor and compacitor C46 is connected to the non-inverting input of operational amplifier OA6, which input is biased to ground through a resistor R54. These component values are preferably selected to provide a low pass Butterworth filter defined by the following equations:

$$T(s) = sK_1'/(s+B)$$

$$T(s) = s^2 K_2'/(s^2 + 2Bs + B^2)$$

$$T(s) = s^3 K_3'/(s^3 + 2Bs^2 + 2B^2 s + B^3)$$

$$T(s) = s^4 K_4'/(s^4 + 2.613 Bs^3 + 3.414 B^2 s^2 + 2.613 B^3 s + B^4)$$

For equations relating to the high pass section of the Butterworth filter, the transfer functions are as follows:

$$T(s) = s/(s + w_1)$$

$$T(s) = s^2/(s^2 + w_2 s + w_2 w_1)$$

$$T(s) = s^3/(s^3 + w_3 s^2 + w_3 w_2 s + w_3 w_2 w_1)$$

$$T(s) = s^4/(s^4 + w_4 s^3 + w_4 w_3 s^2 + w_4 w_3 w_2 s + w_4 w_3 w_2 w_1)$$

In accordance with the above design formulas, the secondary active frequency control is designed to provide tailoring of the response curve between 300 Hz and 3 kHz. The low frequency section of the circuitry of frequency control 35 is designed to control response between 250 Hz and 1200 Hz, the high frequency section being designed to control response between 1400 Hz and 3500 Hz. These figures are those preferred for various purposes contemplated for the invention but are not necessarily rigidly absolute for certain other applications, to which extent they may be subject to variation within the scope of the invention.

To provide such operation, operational amplifier OA5 acts as a buffer to ensure low driving impedance to the low and high frequency control circuits 75. The input impedance of this stage of the buffer amplifier is about 0.1 megohms. Capacitor C40 and resistor R44 provide d.c. blocking and impedance matching for the input of operational amplifier OA5. Resistor R45 provides a feedback path between the output and the non-inverting input of this operational amplifier. Capacitor C42 provides d.c. blocking of the output of the operational amplifier. High frequency control elements comprise resistors R50, R52, and R53. Potentiometer R51 allows the high frequency section of the filter to be set between preferably 0 and 22 db gain. The low frequency section comprises resistors R47, R49 and potentiometer R48, as well as compacitors C43, C44. Potentiometer R48 allows low frequency controll preferably between 0 and 22 db gain.

In effect, node 79 represents the output of the frequency control circuitry 75, being thus supplied to the non-inverting input of operational amplifier OA6, which acts as the active element within this active frequency control circuitry. A feedback path is provided by the interconnection with node 77 because of the interconnection with resistors R49, R53. It may be observed that capacitors C40, C42 provide not only d.c. blocking but establish low frequency roll-off of the circuitry.

Although integrated devices other than the type LM 349 noted above may be utilized, it is preferred that any integrated operational amplifier substituted have a fast slew rate such as better than 2.5 v. per microsecond allowing undistorted full swing performance up to a frequency of 25 kHz. Also, the total harmonic distortion is preferably kept low being typically not greater than 0.05% [0 dbm (i.G.) 0.77 v.] across the complete audio spectrum. In this regard, resistor R46 ensures stability at unity gain as the integrated circuit operational amplifiers are internally compensated for positive gains of 5 or greater, in the case of the LM349 integrated circuit.

Chosen design specifications are preferably such that the low frequency section of the secondary active filter circuitry has a gain of 22 db with a low frequency lower 3 db corner at 30 Hz and with a high frequency upper 3 db corner at 10 kHz.

As referred to herein, the term corner or corner frequency refers to cut-off frequency conventionally representing 3 db insertion loss of the respective circuit.

Circuitry for providing regulated potentials suitable for the operational amplifiers of the secondary active frequency control 35 is illustrated in FIG. 10. In the circuitry shown therein, a pair of terminals 81, 82 provide a.c. line voltage across the primary winding 83 of a transformer having its secondary winding 84 connected across a full wave bridge rectifier 85. Connected across the latter is a first filtering or a.c. decoupling capacitor C48. Across this is connected a pair of resistors R56, R57 which is turn each have connected across them capacitors C50, C51 whereby there is provided a floating ground node 86 intermediate these capacitors. Node 86 is connected to the circuit ground. The potentials on the opposite sides of each of capacitors C50, C51 are provided to respective integrated circuits IC2, IC3, such as each of commercially available type UA7815 integrated circuit regulators. Each such integrated circuit is connected also to the circuit ground and each provides a respective output 87, 88 to provide highly regulated voltages, preferably, +15 v.d.c. and −15 v.d.c. for powering operational amplifiers OA5, OA6 of the secondary active frequency control and others with a voltage stability of within ±1%.

Similar circuitry may be utilized for developing other supply potentials for operation of other components of this system. Alternatively, battery power supplies may be utilized.

Referring to FIG. 6, which demonstrates the circuitry of the secondary dynamic compressor 37, input lead 34 provides the signal processed by secondary active frequency control 35 across a resistor R59 and through a coupling capacitor C53. The signals are then provided through a high frequency emphasis network comprising a capacitor C54 and resistor R60 to a resistor R61. Said resistor R61 then couples the input signal directly to the inverting input of operational amplifier OA7. The inverting and non-inverting inputs of the operational amplifier are tied together by a series circuit comprising a capacitor C55 and resistor R62. The inputs of operational amplifier OA7 are interconnected with a gain cell 85 and a full-wave rectifier 86, both of which preferably are portions of an integrated circuit compressor expandor i.e., compandor, device such as that commercially available under type designation NE570/571, all as described below.

Such a device may also include an internal or self-contained integrated circuit operational amplifier but, in the case of the preferred compandor circuit NE570/571 employed in the present system, the internal operational amplifier is not utilized. Connections are instead made, as indicated in FIG. 6, to the gain cell 85 and rectifier 86 components of such compandor circuit. Also, there are internal resistive components of compandor device including a resistor R63 which is connected to the output 87 of the gain cell and connected at the opposite end to the circuit ground. A node 88 of the circuit represents the input to the gain cell, there being an internal resistor R64. Gain cell 85 is adapted to be controlled by rectifier 86 in accordance with a capacitor interconnected by a terminal 89 of rectifier 86.

Briefly, rectifier 86 provides full-wave rectification of the audio signal supplied to the input of compressor 37, as reflected at the output of operational amplifier OA7, which output signal, as fed back to the rectifier, is averaged by the capacitance seen at terminal 89. The averaged signal is then provided to the gain cell 85 which in turn provides a gain control signal to the inverting input of operational amplifier OA7.

Normally, a capacitance as provided by a discrete circuit capacitor would be interconnected with said terminal 89. But in accordance with the present invention, a capacitance expandor circuit 90 comprising operational amplifiers OA8, OA9 is interconnected with rectifier 86. Circuit 90 includes a capacitor C56 which is interconnected between the output of operational amplifier OA9 and the non-inverting input of operational amplifier OA6, which point is also interconnected with the capacitance input 89 of rectifier 86. The inverting input of operational amplifier is tied directly to its output, which is coupled by a resistor R65 to the non-inverting input of operational amplifier OA9, which input is biased to ground through a pair of diodes D2, D3. A load resistor R66 is connected across the output of operational amplified OA9.

Also shown interconnected with rectifier 86 is a resistor R67 which is internal to the integrated circuit device NE570/571 preferred whereby a terminal or node 91 constitutes the input to the rectifier stage. Interconnected with node 91 is a parallel combination of a resistor R68 and capacitor C58 which provide high frequency preemphasis for the signal provided to the input of the rectifier. Such input is delivered by a capacitor C59 which is interconnected with the output of operational amplifier OA7. Similarly, a capacitor C60 interconnects this output with the input 88 of the gain cell.

Accordingly, there are interconnected with the output of the operational amplifier two feedback paths, a first being provided to the gain cell 85 through capacitor C60 and resistor R64. A second feedback path is provided through capacitor C59, the pre-emphasis network noted above, and resistor R67 to rectifier 86. The rectifier controls the gain provided by gain cell 85, which is an integrated circuit-realized current in, current out device with the ratio $I_{out}/I_{in}$ controlled by rectifier 86 providing an overall gain which is an exponential function of the input signal. Gain cell 85 equivalently functions as an expandor but, since its output 87 is interconnected with the inverting input of operational amplifier OA7, will be seen to provide, in effect, negative feedback for causing compression of the input signal delivered by input lead 36 to be realized.

Furthermore, since circuit 90 operates to expand the apparent magnitude of capacitor C56 as a function of the relative amplitude range of the signal provided at the output of operational amplifier OA7, the amount of current provided by rectifier 86 to gain cell 85 is varied as a further function of the magnitude, i.e., dynamic range, of the signal being processed.

In addition to the foregoing feedback circuits, a further feedback circuit comprising a pair of resistors R70, R71 is interconnected between the output and inverting input of the operational amplifier, there being a capacitor C62 providing a.c. bypass to circuit ground. Resistors R70, R71 provide d.c. feedback path for operational amplifier OA7 since there is no d.c. feedback path through gain cell 85. A bias potential as provided also to the inverting input of the operational amplifier through a resistor R72 by connection of a terminal 92 to a suitable potential.

In addition, the gain cell is provided with a terminal 93 to be supplied with a THD trim potential or bias which is provided through a resistor R73 connected to the wiper 94 of a potentiometer R74 across which is provided a 3.6 volt d.c. potential by means of a terminal 95. Wiper 94 may be positioned to adjust the THD trim. Terminal 93 is also interconnected by resistor R75 with the non-inverting input of operational amplifier OA7.

D.c. shift trim for the gain cell input 88 is provided similarly through a resistor R75 in accordance with the position of wiper 96 of a potentiometer R76 across which a 3.6 volt d.c. potential is supplied. Upon calibration of the circuitry to provide appropriate THD trim and d.c. shift potentials by positioning of wipers 94, 96, their further adjustment is not required.

In order to limit the output potential of operational amplifier OA7, a pair of back-to-back zener diodes D4, D5 are connected between the output and circuit ground, being selected for threshold potential of, for example, preferably, 3 v. to limit the output of the amplifier and preclude it from exceeding predetermined levels. This limits the output swing to avoid overloading any succeeding circuit stage to which the output of the secondary dynamic compressor circuitry is supplied, such as otherwise may occur if excessive signals caused by ignition or electrical noise, etc. are present in the signals being processed. Thus limited, the output of the operational amplifier is provided through a capacitor C63 to output lead 48, across which there is a load resistor R77.

Accordingly it is seen that compressor 37 comprises an operational amplifier (OA7) as well as feedback circuitry interconnecting the output and non-inverting input of this amplifier for providing a nonlinearly increasing negative feedback signal to the input in response to increase in the level of the tonally controlled audio signal on input lead 36. Ignoring the change in attack time or response produced by capacitance expandor circuit 90, the signal gain is $$G_{comp} = K\, I_b^{\frac{1}{2}} / \overline{V}_{in}$$

where $I_b$ is the current flowing into an effective internal summing node of operational amplifier OA7, $\overline{V}_{in}$ is the average input voltage of the audio signal input to compressor 37 and K is merely a gain constant. Gain cell 85 provides an exponential response in gain in response to step changes in amplitude, said exponential response being effected by the time constant resulting from the capacitance represented by circuit 90 at terminal 89 of rectifier 86.

Figure 12:
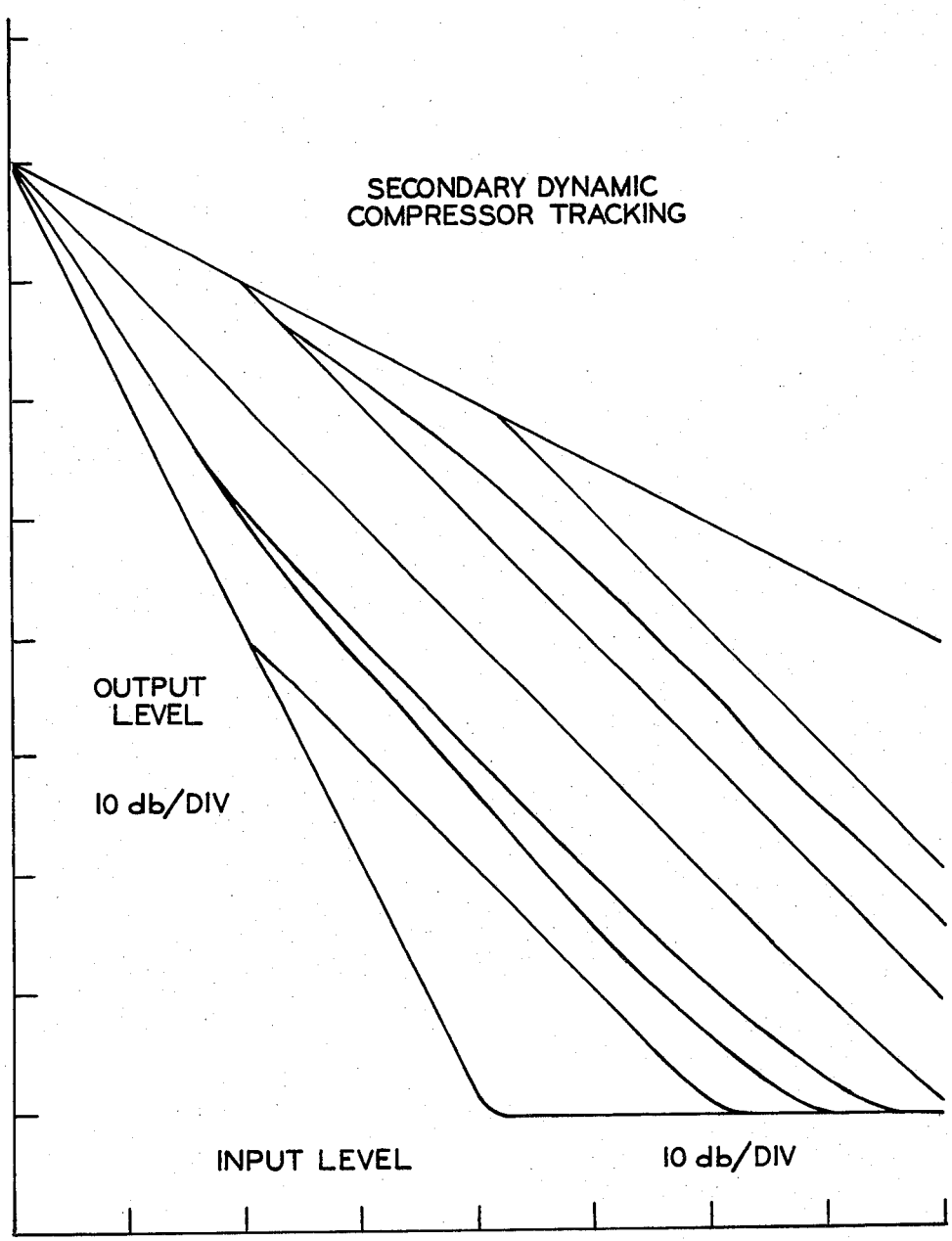
FIG. 12 is a graph of a family of curves illustrating operation of certain compressor circuitry of the invention.

In FIG. 12, a family of curves represents typical input-output tracking of compressor 37. The ordinate represents output level and the abscissa represents the input level.

The following table indicates circuit components and nominal values thereof which preferably may be utilized in the construction of the secondary dynamic control circuitry 37 wherein operational amplifier OA7 may be of commercially available type TDA1034 and operational amplifiers OA8, OA9 may each be of commercially available type LM387:

TABLE II

| | | | |
|---|---|---|---|
| R59 | 100 kohm | C53 | 1 mfd |
| R60 | 62 kohm | C54 | 0.005 mfd |
| R61 | 20 kohm | C55 | 270 pfd |
| R62 | 22 kohm | C56 | 1 mfd |
| R63 | 30 kohm | C58 | 0.01 mfd |
| R64 | 20 kohm | C59 | 2 mfd |
| R65 | 1 kohm | C60 | 5 mfd |
| R66 | 1 kohm | | |
| R67 | 10 kohm | C62 | 10 mfd |
| R68 | 30 kohm | C63 | 5 mfd |
| R70 | 47 kohm | | |
| R71 | 47 kohm | | |
| R72 | 68 kohm | | |
| R73 | 220 kohm | | |
| R74 | 100 kohm | | |
| R75 | 1 kohm | | |
| R76 | 220 kohm | | |
| R77 | 100 kohm | | |
| R78 | 100 kohm | | |

With respect to the operation of the secondary dynamic compressor 37, it may be observed that operation in accordance with the invention involves reconstituting harmonics typically characteristic of human speech, among other aspects of operation, which harmonics otherwise would be of inaudible and of essentially ineffective amplitude if the audio signal were not processed in accordance with the invention, owing to constraints imposed by normal compression or narrow-band filtering normally encountered in modulation and RF transmission systems. Accordingly, it is desired that operational amplifier OA7 be of a relatively high quality character, providing typically a high slew rate and capable of providing transmission of audio frequencies up to at least 15–16 kHz. Also, in the case of commercial types LM387 utilized for realizing operational amplifiers OA8, OA9, a minimum upper band width is typically 75 kHz although lesser values may be utilized. Thus, the circuitry utilized exhibits high gain and wide bandwidth. For increased stability, in view of these characteristics, an input compensation network constituted by capacitors C53, C54 and resistor R60 is utilized.

Circuit 90 is a gyrator which effectively increases the capacitance at terminal 89, being the apparent magnitude of capacitor C56, in accordance with decrease in signal level, i.e., the dynamic input of compressor 37. Thus, in effect, the response time of the compressor becomes considerably longer at low signal levels, since circuit 90 operates effectively to speed up the compressor attack time at such low signal levels. For example, when the rectifier input level drops from 30 dbm to −30 dbm, the time constant increases from 10.7 $C_{rect} \times 10^3$ to 32.6 $C_{rect} \times 10^3$, where $C_{rect}$ is the effective capacitance interconnected with rectifier 86. This in turn effects the gain cell response because gain cell 85 is controlled by rectifier 86. This avoids or greatly reduces any mistracking of low signal dynamics. Here it is noted that in compressor-expandor (compandor) system in which the overall gain is unity such change in attack time would not produce any overall gain error, and the resultant gain or loss would appear to be manifested as such mistracking of low signal dynamics. But in the present system wherein compression techniques are primarily used, such problem is largely averted, since unity gain is not necessarily provided.

Accordingly, the compressor is operating at high gain when there is a small input signal, but when a higher level input signal is provided to the circuit lead 34, the circuitry operates to effectively reduce the gain. Overloading is, however, precluded even in the case of a large signal supplied to input 34 (as for example, ignition noise) because of the clamping action of diodes D3, D4, D5.

Furthermore, with regard to transient response, it will be observed that the time taken for the compressor to recover from an overload condition is determined by the capacitance interconned at terminal 89 of the rectifier 86. If there were a smaller capacitor, faster response to transients would be permitted but such would produce more low frequency THD because of gain modulation. The use of a relatively small capacitance, i.e., one microfarad for capacitor C56 and circuit 90 avoids such a difficulty in the present system. In effect, THD which otherwise would be generated by the compressor is effectively cancelled by circuit 90.

Moreover, compressor-expandor systems heretofore utilized are subject to a problem known as breathing. This comes about since, as a system is changing its gain, the change in background noise level sometimes can be heard. In order to avoid this problem, capacitor C54 and resistor R60 as well as capacitor C58 and resistor R68 provide high frequency pre-emphasis by altering compression gain accordingly.

In calibrating the circuitry of FIG. 6 for operation, wiper 94 of potentiometer R74 is adjusted for proper THD trim by utilizing a 0 dbm signal at 10 kHz input audio input signal to the system and will be referenced by meter 45. Also the d.c. trim potentiometer R77 may have its wiper 96 adjusted to provide minimum envelope bounce when inserted tone bursts are applied to the input of the system.

It is preferred that the secondary dynamic compressor circuitry will provide up to 135 db of dynamic compression for a 0 db input signal.

Figure 9:
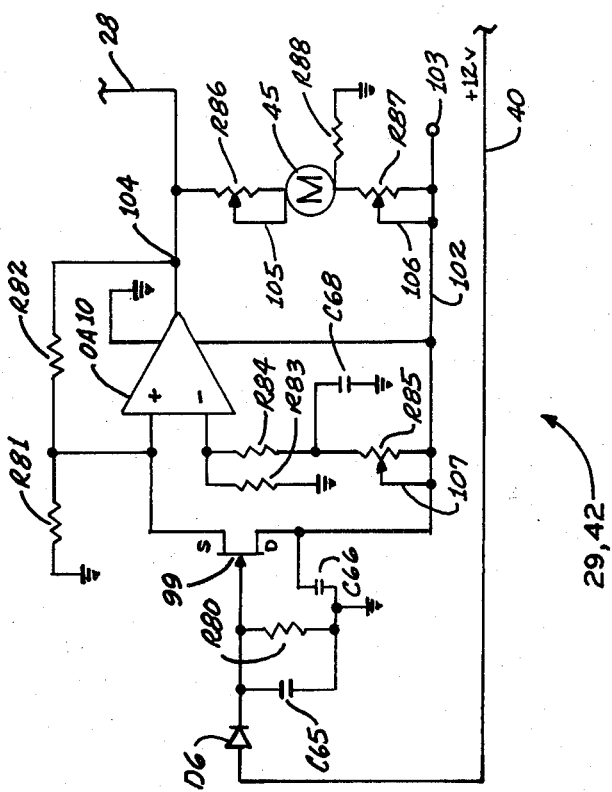
FIG. 9 is a schematic circuit diagram of circuitry of an automatic gain control as well as meter drive circuitry and a meter for indicating operation performance of the system of FIG. 1.

Referring now to FIG. 9, the automatic gain control (AGC) circuit 29 is shown. Lead 41 provides an input for tha audio frequency signals processed by the secondary dynamic compressor 37. The output of the latter effectively provides a tracking voltage provided by feedback circuit to the d.c. rectification stage, i.e., rectifier 86 and expandor circuit 90, of the secondary compressor 37, while serving also to deliver the processed audio signals to bandpass output filter 52. This AGC input is supplied to a diode D6 for rectification and thence to the gate of a field effect transistor (FET) 99. Connected between the gate and drain electrodes thereof is a time constant delay circuit for providing a delayed action of the AGC circuitry and comprising a capacitor C65 in parallel with a resistor R80, both connected at one end to the circuit ground, and a capacitor C66 having one end connected to the drain electrode of the FET.

The FET effectively isolates the input by its high impedance, being adapted by change in its conductivity to change the level of a signal applied to the non-inverting input of an operational amplifier 0A10, which input is biased to ground through a resistor R81 and interconnected to the output of the operational amplifier for feedback purposes through a resistor R82 thereby to establish control over the gain of the latter.

The inverting input is biased to ground through a resistor R84 and is connected through a resistor R84 and potentiometer R85 having its opposite end and a wiper 101 tied to a lead 102 which is supplied by a terminal 103 with positive voltage, i.e., 12 v.d.c., whereby the gain of the operational amplifier may be controlled by the setting of wiper 101. Further, a bypass capacitor C68 couples to ground any AC component present on lead 102. Lead 102 is shown interconnected with the lead 103 for supplying the operational amplifier with its operating voltage.

Connected between lead 102 and the output 104 of the operational amplifier is a circuit comprising a pair of potentiometers R86, R87 and meter 45, which is preferably of the moving coil type. The output 104 is tied directly to lead 28 for providing an AGC feedback connection to the primary voltage compressor 27. One side of the meter 45 is connected to ground through resistor R88. Wipers 105, 106 of potentiometers R86, R87 provide calibration of the meter.

The meter indicates the overall signal compression gain level and thus displays an indication of the extent to which the system is being utilized to capacity. The meter is of the moving coil type, providing averaging of the instantaneous variations in the output of operational amplifier 0A10 to avoid wildly fluctuating changes in the indicated output which would be difficult to observe.

For proper operation, wiper 101 is adjusted to permit variation in the level of voltage provided to the inverting input of the operational amplifier within a normal swing or variation in the potential at output 104 of from about +2 to about +9 v.d.c., which potentials are of the proper magnitude for the primary voltage compressor 27.

There is thus provided a feedback signal to the primary voltage compressor from the automatic gain control 29 in accordance with the extent of compression by secondary dynamic compressor 37. As a consequence, a negative or limiting feedback occurs which operates to provide the function of controlling the amount of THD by limiting the primary voltage compression as a function of the compression provided by the secondary compressor 37. Thus, not only does the feedback serve to control overall dynamic compression but there is also a control of the bandwidth of the system by limiting out-of-band harmonics which would otherwise pass through the system as a result of THD.

For certain applications of the invention, one might permit rapid secondary reaction, so that the feedback to the primary compressor 27 would operate to prevent an overload resulting from excesses in the output of the secondary dynamic compressor 37, thus avoiding overdriving of the output. For example, digital signals of the type involved in data transfer might require such rapid reaction. Also in the case of data transmission rather than audio, narrow bandwidths are involved so that one need not provide capacity for handling harmonics normally present in speech or other audio.

The amount of delay which results in the AGC delay path is preselected in accordance with applications of the system and the type and character of signals to be processed. Variation of the AGC time constant are provided by capacitor C65 and resistor R80 which may be varied, as by selection of different components. Of course, conventional multipole switches may be used to permit capacitances and resistances of various values to substituted for capacitance 65 and resistor R80. Examples of the AGC delay which may be provided by capacitor C65 and R80 are from 0.010 seconds to 3 seconds, as a broadly preferred range, whereas typically a delay of 0.3–0.5 seconds may be adequate for various types of audio signals. In general, the delay is to be shorter, i.e., for faster response for transmission of signals of the data character and slower such as 0.3–0.5 seconds or even longer for signals of audio or voice character. In this way, the amount of AGC feedback can be established in direct relevance to the amount of out-of-band harmonics expected to be present in the signals being transmitted.

As noted above, an LED drive circuit 49 and LED 50 of the circuit configuration shown in FIG. 8 is also connected to the output 48 of secondary dynamic compressor 37 thereby to indicate the amount of compression attained by compressor 37. In this regard, the LED 50 is utilized to signal an overload condition resulting from excessive compression. Thus, for a normal 0 db input, i.e., 120 db compression, the control of the system may be adjusted to provide operation under conditions such that peak compression can be handled, as indicated by elimination of LED 50 during permit rapid secondary reaction, so that the feedback to the primary compressor 27 would operate to prevent an overload resulting from excesses in the output of the secondary dynamic compressor 37, thus avoiding overdriving of the output. For example, digital signals of the type involved in data transfer might require such rapid reaction. Also in the case of data transmission rather than audio, narrow bandwidths are involved so that one need not provide capacity for handling harmonics normally present in speech or other audio.

The amount of delay which results in the AGC delay path is preselected in accordance with applications of the system and the type and character of signals to be processed. Variation of the AGC time constant are provided by capacitor C65 and resistor R80 which may be varied, as by selection of different components. Of course, conventional multipole switches may be used to permit capacitances and resistances of various values to substituted for capacitance 65 and resistor R80. Examples of the AGC delay which may be provided by capacitor C65 and R80 are from 0.010 seconds to 3 seconds, as a broadly preferred range, whereas typically a delay of 0.3–0.5 seconds may be adequate for various types of audio signals. In general, the delay is to be shorter, i.e., for faster response for transmission of signals of the data character and slower such as 0.3–0.5 seconds is even longer for signals of audio or voice character. In this way, the amount of AGC feedback can be established in direct relevance to the amount of out-of-band harmonics expected to be present in the signals being transmitted.

As noted above, an LED drive circuit 49 and LED 50 of the circuit configuration shown in FIG. 8 is also connected to the output 48 of secondary dynamic compressor 37 thereby to indicate the amount of compression attained by compressor 37. In this regard, the LED 50 is utilized to signal an overload condition resulting from excessive compression. Thus, for a normal 0 db input, i.e., 120 db compression, the control of the system may be adjusted to provide operation under conditions such that peak compression can be handled, as indicated by elimination of LED 50 during processing of audio signals, the controls being adjusted to prevent LED 50 from normally remaining illuminated.

The output of the secondary dynamic compressor 48, as thus monitored, is provided to bandpass output filter 52, the circuitry of which is shown in FIG. 7.

Referring to FIG. 7, an operational amplifier OA11 receives thus processed audio frequency signals through a pair of capacitors C70, C71. The non-inverting input to which the signal is supplied is also biased to ground through capacitor C72. A node 108 between capacitors C70, C71 is biased to ground through a resistor R89 and also is provided through a capacitor C73 with a feedback signal provided by the output of the operational amplifier. A further feedback path is provided through a resistor R90 directly to the non-inverting input, which is biased to ground through a resistor R91. The inverting input is connected to circuit ground through capacitor C74. A terminal 109 is provided for providing d.c. operating voltage for the operational amplifier OA11 as well as a further operational amplifier OA12, the two being both preferably part of the same integrated circuit such as that commercially available under type LM387. The power supply terminals connected to ground through a conventional bypass capacitor C74.

The output of operational amplifier OA11 is coupled through a capacitor C75 and resistors R92, R93 to the non-inverting input of an operational amplifier OA12. The latter input is biased to ground through a resistor R94 and also through a capacitor C76. Feedback for operational amplifier OA12 is provided first by resistor R95 which is connected between the output and a node 110 between resistors R92, R93. This node is coupled to ground through a capacitor C77. Feedback is also provided directly to the non-inverting input through a capacitor C78. The inverting input of operational amplifier OA12 is connected to ground through a capacitor C80. The output of operational amplifier OA12 constituted the output of the bandpass output filter.

Thus, there is provided a bandpass output filter having high frequency and low frequency sections and preferably providing low frequency gain of 22 db with the low frequency upper 3 db corner at 30 Hz and with the high frequency upper 3 db corner at 10 kHz. It is emphasized that bandpass output filter 52 is adapted for providing a considerably greater pass band than that of bandpass input filter 19. Selection of component values to achieve these corner frequencies and pass band characteristics as described above will be apparent to those skilled in the art.

As previously observed, a switch SW2 is connected in a lead 53 which extends from the input 48 to the output 15 of the bandpass output filter and, when closed, switch SW2 thus directly connects the input to the output for bypassing the bandpass filter, just as input bandpass may be desired for testing or specialized purposes of the invention, or when processing narrow band signals which do not require filtering before or after processing. Lead 55 supplies the output of band pass output filter 52 to the high level output stage 56, which is shown in FIG. 11.

Referring to FIG. 11, lead 55 provides the processed audio frequency signal through a coupling capacitor C81 to the input terminal of an integrated circuit amplifier IC4 is interconnected with the following components having nominal values as indicated:

TABLE III

| R96  | 1 kohm   | C81 | 0.1 mfd  |
|------|----------|-----|----------|
| R97  | 820 kohm | C82 | 15 mfd   |
| R98  | 100 kohm | C83 | 25 mfd   |
| R99  | 560 kohm | C84 | 0.01 mfd |
| R100 | 47 kohm  | C85 | 1 mfd    |
| R101 | 47 kohm  |     |          |
| R102 | 1 kohm   |     |          |

A terminal 111 is provided for supplying operating voltage, e.g., 12 v.d.c. through resistor R99 for powering the integrated circuit IC4. Amplifier circuit 56 operates in effect to provide a buffering of the output 15 and for providing high level, e.g., with 40 db gain, useful for driving various auxilary aparatus, such as oscilloscopes, monitor displays, frequency counters, spectrum analyzers, and the like.

Operation of the System

The system shown in FIG. 1 is connected to a suitable source of audio signals, such as the output of a microphone, pre-amplifier, tape recorder, or the output of various intermediate stages present in transmitters, receivers or the like where it is desired to utilize the system for processing audio signals provided by such a source. In this regard, the source may be at either end of an RF transmission link. Thus, if the source may be the intermediate application stage of a modulation system providing an audio signal to modulate an RF signal, as in AM, FM, SSB, etc., the system may be utilized for improving intelligibility and clarity of such audio signals utilized for modulation, thereby to improve the character of the transmitted radio frequency information, even though such may be in a relatively narrow band such as 3 kHz. Or, the source may be an intermediate amplification stage of a receiver which amplifies a demodulated audio signal, which similarly may be of a very limited bandwidth as received, so as to retrieve from the received modulated audio signals clarity and intelligibility and general characteristics of normal human voice or other tonal signals. In such uses, the system enhances the character of the signals transmitted or received to achieve the various objects of the invention.

But such use of the system is not necessarily limited to only one end of an RF transmission link. Instead, a system of the invention may be utilized as each end of such a link. And, when so utilized, the two systems or units of the invention effectively multiply the phenomena produced by the single system on either end of such a link. When utilized on both ends, the system in effect provides what is most closely analogous to a compressor-expandor phenomenon in view of the fact that the system as thus utilized to process both the transmitted and received audio information adds substantial dynamic range as well as improves the S/N ratio. But in the strict sense, the system is not merely a compressor-expandor (compandor), since a compandor is a combination of a compressor at one point in a communication path for reducing the amplitude range of signals followed by an expandor at another point for complementary increase in the amplitude range for increasing the S/N ratio.

Regardless of its use in one of the types of situations referred to above, and as more fully contemplated in accordance with the objects of the invention and as described here and above, the new system provides overall performance which goes well beyond that of a compandor in the customary sense, since it not only improves S/N ratios but also reconstitutes lost harmonics and improves clarity, intelligibility and generally enhances the character of signals processed therethrough. Without use of the new system, the usually audible characteristics of human speech, involving various harmonics particularly of the higher order which gives life-like, normal chacter as well as richness and quality to human speech are typically so suppressed or reduced in magnitude in narrow band transmission as to deprive the received voice signals of character and intelligibility. The processing of audio signals by the invention involves effective reconstitution of these various harmonically related attributes of speech so that the processed audio has a richness characterized by the presence of out-of-band harmonics which have been returned to the processed audio, producing normal life-like, intelligibility of the audio signal, particularly speech.

Effectively, one may think of the operation of the system as first involving the pulling out or limiting certain out-of-band harmonics which normally would be present in signals amplified, and then subsequently returning such harmonics to the signal in such a way that they are emphasized to advantage. One may liken the system to the use of a crystal oscillator circuit which, through ringing, may be utilized to create harmonics. In this analogous way, the system returns harmonics of human speech to audible levels of fundamental frequency. This manifestation is not well understood, but is an attribute of such significance that it is best appreciated only upon objective aural comparison between signals from various sources processed, and those not processed, through use of the invention.

In a practical embodiment of the invention, the user is preferably provided with ready panel-front access to gain control potentiometer R9 for variation of the wiper 59 thereof to control the level of signals provided to the primary active frequency control circuit 23. Also, the user is provided with controls for varying the position of potentiometer wipers 61 and 65 to preselect the amount of gain within the low and high frequency portions of primary active frequency control 23 in accordance with the type of signal to be processed. In addition, the wipers for tone control potentiometer R48, R51 are preferably controllable by the user to preselect the response of secondary active frequency control circuit 35 and front panel accessibility is provided for controlling the wiper of potentiometer of R61 to allow selective response not only of the overall gain provided by the secondary dynamic compressor operational amplifier 0A7 but also for controlling the THD during operation of the secondary dynamic compressor 37. Of course, as noted above, switches SW1, SW2 are also located for operator usage to permit selective use of the bandpass input and output filters 19, 52. Additionally, meter 45 is located for being observable by the user.

The circuit values of the LED drive circuits 31, 49 are each chosen to provide for energization of the respective LED 33, 50 when the output of the compressor 27, 37 respectively interconnected with each drive circuit is providing maximum compression. Thus, referring to LED 33, the operator may provide adjustment of primary active frequency control gain potentiometer R9 so as to allow the output of the primary voltage compressor 27 to reach its full maximum value, thus being indicated by illumination of LED 33. This LED will remain unlit when primary compressor 27 is operating at less than full compression. The user may thus appropriately adjust the overall system gain to allow normal operation to proceed so that LED 33 would only light upon maximum peak magnitude of signals being processed. Similarly, potentiometer wiper 84 of the secondary dynamic compressor 37 is adjusted so that LED 50 normally will remain unlit but will flash momentarily only at maximum peak signal levels.

The user is continuously provided by meter 45 with an indication of the extent to which the system is operating to the extent of its capabilities thus displaying the overall performance of the system.

In conjunction with the use of meter 45, it is noted that its indication when speech signals are being processed by the system is such as to give a visual indication of the averaged output voltage of secondary compressor 37, but at the same time the meter will indicate fluxation in dynamic audio content. This indication is particularly useful when speech is being processed through the system. However, it is noted that when data signals are processed through the system, such as in the case of fascimile or teletype signals, meter 45 produces only an average reading from any given dynamic fluxation pattern, since dynamic voltage peaks will appear far too fast to be tracked by the moving coil type of movement of meter 45. On the other hand, the indication provided by LED 50 is such that any rapid increase in signal which may be in excess of the maximum compression utilizable will be instantaneously displayed by flashing of the LED.

It is, therefore, seen that the system is provided with the minimum of control as well as relatively simple, easily understood indications for properly monitoring its operation and determining performance. Additionally, by virtue of its IC circuitry, the system is easily housed in a compact, small lightweight enclosure or cabinet and may, if desired, be battery powered to provide complete portability as well as long periods of operating time.

Although the foregoing includes a description of the best mode contemplated for carrying out the invention, various modifications are contemplated.

For example, it is within the purview of the invention to allow the compression levels of the various circuits to be varied as well as to allow the compression circuitry of the invention to be operated in an expansion mode for increasing, rather than decreasing, dynamic range, as may be desirable. When circuitry of the system is utilized in such mode, high frequency de-emphasis may be utilized in the system wherein expansion occurs to compensate for high frequency pre-emphasis which is normally performed by secondary compressor 37 in the system presently configured.

As various modifications could be made in the constructions herein described and illustrated without departing from the scope of the invention, it is intended that all matter contained in the foregoing description or shown in the accompanying drawings shall be interpreted as illustrative rather than limiting.

What is claimed is:

1. An audio processing system comprising audio signal input means for receiving an audio signal to be processed, and audio signal output means for providing a processed audio signal for further use, and characterized by primary frequency control means for selectively controlling the relative level of said audio input signal to be processed within a plurality of different audio frequency bands thereby to provide a first frequency controlled signal, a primary dynamic compressor including a controllable gain cell, the gain of which varies as a function of the signal magnitude thereto for dynamically compressing the first frequency controlled signal thereby to provide a primarily compressed audio signal, secondary frequency control means for selectively controlling the relative level of said primarily compressed signal within a plurality of different audio frequency bands, thereby to provide a frequency controlled primarily compressed signal, a secondary dynamic compressor including a controllable gain cell, the gain of which varies as a function of the signal magnitude thereto for dynamically compressing said frequency controlled primarily compressed signal, thereby providing a secondarily compressed signal and a time-delaying, gain-limiting feedback circuit means interconnected between said primary and secondary dynamic compressors for limiting the dynamic compressing of said input signal by said primary dynamic compressor as a time-delayed function of increase in the level of said secondarily compressed signal, said audio signal output means providing said secondarily compressed signal as said processed audio signal.

2. An audio processing system as set forth in claim 1 and further characterized by said secondary dynamic compressor including means for effecting compressing of said frequency controlled primarily compressed signal at a response time which is a function of the level of the last-said signal.

3. An audio processing system as set forth in claim 2 and further characterized by said secondary dynamic compressor comprising high frequency pre-emphasis circuit means for altering the compression in a sense tending to avoid audible changes in background noise level in said processed audio signal.

4. An audio processing system as set forth in claim 1 and further characterized by said primary and secondary frequency control means each providing controlling of the relative level of signals within at least low and high frequency bands, the high frequency band of said secondary frequency control means having a cutoff value much greater over that of the high frequency band of said primary frequency control means, whereby the bandwidth of the secondary frequency control means is much greater than the bandwidth of the primary frequency control means.

5. An audio processing system as set forth in claim 1 and further characterized by said primary and secondary frequency control means each comprising a plurality of active amplifier means for selectively amplifying signals of a respective frequency band, and means for selectively controlling gain of the active amplifier means with each said frequency band.

6. An audio processing system as set forth in claim 1 and further characterized by output bandpass filter means for filtering said secondarily compressed signal and providing a pass band of not greater than about 3 kHz for limiting the bandwidth accordingly of said processed audio signal.

7. An audio processing system as set forth in claim 6 and further characterized by input bandpass filter means for filtering said audio signal to be processed and providing a pass band of not greater than about 3 kHz for limiting the bandwidth accordingly of said audio signal to be processed.

8. An audio processing system as set forth in claim 7 and further characterized by means for selectively disabling either of said input and output bandpass filters to prevent limiting of the bandwidth of signals by either said filter.

9. An audio processing system as set forth in claim 1 and further characterized by display means interconnected with said secondary dynamic control means for providing an averaged indication of the level of said secondarily compressed signal.

10. An audio processing system as set forth in claim 1 and further characterized by first and second display means respectively interconnected with said primary and secondary dynamic compressors for indicating a peak level of dynamic compression thereof.

11. An audio processing system comprising audio signal input means for receiving an audio signal to be processed, and audio signal output means for providing a processed audio signal for further use, characterized by primary dynamic control means for dynamically compressing the input signal thereby to provide a primarily compressed audio signal, frequency control means for selectively controlling the relative level of said primarily compressed signal within different audio frequency bands, thereby to provide a frequency controlled primarily compressed signal, secondary dynamic control means for dynamically compressing said frequency controlled primarily compressed signal, thereby supplying a secondarily compressed signal, and feedback means interconnected between said primary and secondary dynamic control means for limiting the dynamic compressing of said input signal as a time-delayed function of increase in the level of said secondarily compressed signal, said audio signal output means providing said secondarily compressed signal as said processed audio signal, said secondary dynamic control means comprising a differential operational amplifier having inverting and non-inverting differential inputs and a single output providing an output signal which is a function of the differences between signals applied to said differential inputs, gain control feedback circuitry interconnecting the output and inverting input including a gain cell adapted for providing a gain control signal to said inverting input for reducing gain with increase in the signal level at said output, rectifier means for averaging the signal provided to said secondary dynamic control means, said rectifier means controlling said gain cell as a function of the average of said signal thus provided, said rectifier including an averaging capacitance and circuit means for electronically expanding the effective magnitude of said capacitance to alter compression attack time for low levels of said signal thus provided.

12. An audio processing system as set forth in claim 11 and further characterized by said capacitance expandor means comprising a circuit including a fixed capacitance and active amplifier means for equivalently magnifying said fixed capacitance.

13. An audio processing system as set forth in claim 12 and further characterized by said operational amplifier means of said capacitance expandor means comprising at least one operational amplifier having a non-inverting input and an output, said fixed capacitance being connected between the last said input and output.

14. An audio processing system comprising audio signal input means for receiving an audio signal to be processed, and audio signal output means for providing a processed audio signal for further use, characterized by primary dynamic control means for dynamically compressing the input signal thereby to provide a primarily compressed audio signal, frequency control means for selectively controlling the relative level of said primarily compressed signal within different audio frequency bands, thereby to provide a frequency controlled primarily compressed signal, secondary dynamic control means for dynamically compressing said frequency controlled primarily compressed signal, thereby supplying a secondarily compressed signal, and feedback means interconnected between said primary and secondary dynamic control means for limiting the dynamic compressing of said input signal at a time-delayed function of increase in the level of said secondarily compressed signal, said audio signal output means providing said secondarily compressed signal as said processed audio signal, said first and second dynamic control means each comprising a differential operational amplifier having inverting and non-inverting inputs and a single output providing an output signal which is a function of the differences between signals provided to the last-said inputs, said inverting input receiving a respective signal, means for supplying a reference voltage to said non-inverting input, a first feedback circuit path between said amplifier output and inverting input including a rectification circuit for rectifying current in said feedback path, a capacitance interconnected with said rectification circuit for averaging the rectified current, a second feedback circuit interconnecting said amplifier output and said inverting input including a gain cell, interconnected with said rectification circuit, for increasing the gain of the signal at said amplifier output to provide a gain-increased feedback signal to said inverting input which is an exponential function of the average of said rectified current, and a DC feedback circuit interconnecting said amplifier output and inverting input and including resistance for controlling the gain of said operational amplifier.

15. An audio processing system comprising audio signal input means for receiving an audio signal to be processed, and audio signal output means for providing a processed audio signal for further use, characterized by primary dynamic control means for dynamically compressing the input signal thereby to provide a primarily compressed audio signal, frequency control means for selectively controlling the relative level of said primarily compressed signal within different audio frequency bands, thereby to provide a frequency controlled primarily compressed signal, secondary dynamic control means for dynamically compressing said frequency controlled primarily compressed signal, thereby supplying a secondarily compressed signal, and feedback means interconnected between said primary and secondary dynamic control means for limiting the dynamic compressing of said input signal as a time-delayed function of increase in the level of said secondarily compressed signal, said audio signal output means providing said secondarily compressed signal as said processed audio signal, said feedback means comprising amplifier means having an input interconnected with an output of said secondary dynamic control means for providing an automatic gain control voltage representing the output level of said secondarily compressed signal, said primary dynamic control means including a gain cell and amplifier means controlled by said gain cell for providing compression, said gain cell having an input and means interconnecting the output of said amplifier means with the gain cell input of said primary dynamic control means for limiting compression gain of said primary dynamic control means.

16. An audio processing system as set forth in claim 15 and further characterized by said feedback means including circuit means for providing a time-delayed unipolar signal to said amplifier means thereof derived from said secondarily compressed signal.

17. An audio processing system comprising audio input means for receiving an audio signal to be processed, and audio signal output means for providing a processed audio signal for further use, characterized by input bandpass filter means for filtering said audio signal to be processed to selectively limit bandwidth thereof, primary active frequency control means for selectively controlling the relative level of the audio signal provided from said primary bandpass, filter means within plurality of different audio frequency bands thereby to provide a frequency controlled signal, a primary dynamic compressor including a controllable gain cell, the gain of which varies as a function of the signal magnitude thereto, for dynamically compressing said frequency controlled signal thereby to provide a primarily compressed signal, secondary active frequency control means for selectively controlling the relative level of said primarily compressed signal within a plurality of different audio frequency bands thereby to provide a frequency controlled primarily compressed signal, a secondary dynamic compressor including a controllable gain cell, the gain of which varies as a function of the signal magnitude thereto, for dynamically compressing the last-said signal, thereby supplying a secondarily compressed signal, a time-delaying, gain-limiting feedback circuit means interconnected between said primary and secondary compressor means as a time-delayed function of increase in the level of said secondarily compressed signal, and output bandpass filter means for filtering said secondarily compressed signal to selectively limit bandwidth thereof, said output means providing the last-said signal provided by said output bandpass filter means as said processed audio signal.

18. An audio processing system as set forth in claim 17 and further characterized by the gain cell of said secondary compressor being a capacitance controlled gain cell, and capacitance expandor means for varying an effective capacitance controlling said gain cell to effect compressing of said frequency controlled primarily compressed signal at a response time which is a function of the level of the last-said signal.

19. An audio processing system as set forth in claim 18 and further characterized by said capacitance expandor means comprising a fixed capacitance and active amplifier means for equivalently magnifying said fixed capacitance to provide said effective capacitance of increasing value as a function of decrease in the level of the last-said signal.

20. An audio processing system as set forth in claim 17 and further characterized by said feedback means providing a time-delayed feedback signal to said primary dynamic control means with a time constant within the range of from 0.01 to 3 seconds.

21. A signal processing system for improving signal-to-noise ratios and reconstituting otherwise-lost components of signals to improve signal clarity, intelligibility and character through processing, said system comprising signal input means for receiving an input signal to be processed, and signal output means for providing a processed output signal for further use, and characterized by primary frequency control means for selectively controlling the relative level of said input signal to be processed within a plurality of different audio frequency bands to provide a first frequency controlled signal, a primary dynamic compressor, including a controllable gain cell the gain of which varies as a function of the signal magnitude thereto, for dynamically compressing the first frequency controlled signal thereby to provide a primarily compressed audio signal, secondary frequency control means for selectively controlling the relative level of said primarily compressed signal within a plurality of different frequency bands, thereby to provide a frequency controlled dynamically compressed signal, a secondary dynamic compressor, including a controllable gain cell the gain of which varies as a function of the signal magnitude thereto, for dynamically compressing said frequency controlled primarily compressed signal thereby to supply a secondarily compressed signal, and a time-delaying, gain-limiting feedback circuit interconnected between said primary and secondary dynamic compressors for limiting the dynamic compressing of said input signal by said primary dynamic compressor as a time-delayed function of increase in the level of said secondarily compressed signal, said signal output means providing said secondarily compressed signal as a processed output signal.

22. A signal processing system as set forth in claim 21 and further characterized by said feedback circuit providing a time-delayed signal to said primary dynamic compressor with a time constant within the range of from 0.01 to 3 seconds.

23. A signal processing system as set forth in claim 22 and further characterized by said first and second dynamic compressors each comprising a differential operational amplifier having inverting and non-inverting inputs and a single output providing an output signal which is a function of the differences between signals provided to the last-said inputs, said inverting input receiving a respective signal, means for supplying a reference voltage to said non-inverting input, a first feedback circuit path between said amplifier output and inverting input including a rectification circuit for rectifying current in said feedback path, a capacitance interconnected with said rectification circuit for averaging the rectified current, a second feedback circuit interconnecting said amplifier output and said inverting input including said gain cell, interconnected with said rectification circuit, for increasing the gain of the signal at said amplifier output to provide a gain-increased feedback signal to said inverting input which is an exponential function of the average of said rectified current, and a DC feedback circuit interconnecting said amplifier output and inverting input and including resistance for controlling the gain of said operational amplifier.

24. A signal processing system as set forth in claim 23 and further characterized by first and second means for indicating a peak level of dynamic compression by said primary and secondary compressors, respectively, to permit maximizing of the primary and secondary compression.

* * * * *